United States Patent [19]

Seiler et al.

[11] 4,178,619

[45] Dec. 11, 1979

[54] PROTECTIVE INTEGRATED CIRCUIT NETWORK, PARTICULARLY FOR CONNECTION TO AN INDUCTIVE LOAD

[75] Inventors: Hartmut Seiler, Reutlingen; Adolf Kugelmann, Leonberg, both of Fed. Rep. of Germany

[73] Assignee: Robert Bosch GmbH, Stuttgart, Fed. Rep. of Germany

[21] Appl. No.: 823,286

[22] Filed: Aug. 10, 1977

[30] Foreign Application Priority Data

Aug. 25, 1976 [DE] Fed. Rep. of Germany ....... 2638177

[51] Int. Cl.² ............................................. H02H 7/20
[52] U.S. Cl. ................................. 361/91; 330/207 P; 307/318; 361/18; 361/111
[58] Field of Search ................... 361/56, 91, 18, 100, 361/101, 111, 159, 110; 307/318, 327, 237, 100; 330/207 P; 323/22 Z

[56] References Cited

U.S. PATENT DOCUMENTS

| | | | |
|---|---|---|---|
| 3,252,051 | 5/1966 | Walker | 361/91 X |
| 3,340,407 | 9/1967 | Sinclair | 307/327 X |
| 3,421,025 | 1/1969 | Mitchell et al. | 361/91 X |
| 3,577,063 | 5/1971 | Hurd | 361/91 X |
| 3,641,407 | 2/1972 | Scott | 361/91 X |
| 3,770,986 | 11/1973 | Drehle | 307/318 X |
| 3,815,049 | 6/1974 | Beurrier | 307/318 X |

*Primary Examiner*—Patrick R. Salce
*Attorney, Agent, or Firm*—Frishauf, Holtz, Goodman & Woodward

[57] ABSTRACT

To permit entire integration of a control circuit to switch an inductive load, and protect the integrated control circuit against inductive voltage kicks, voltage surges, and reverse polarity, a series circuit including a diode, which may be constructed as a transistor in diode connection, and a voltage limiting element, typically a Zener diode, or a Zener diode controlled transistor, or four-layer diode are connected in parallel to the main switching path of the semiconductor element which controls current flow through the inductive load, thereby eliminating the necessity of the free wheeling and anti-conductive voltage kick diode which, in combination with the inherent substrate diodes of the inductive circuit, might lead to the damage, or destruction of the IC.

17 Claims, 5 Drawing Figures

PROTECTIVE INTEGRATED CIRCUIT NETWORK, PARTICULARLY FOR CONNECTION TO AN INDUCTIVE LOAD

Cross reference to related applications assigned to the assignee of the present application:
Ser. No. 823,285, filed Aug. 10, 1977, Seiler;
Ser. No. 823,287, filed Aug. 10, 1977, Seiler.

The present invention relates to the protective integrated circuit network to protect the integrated circuit against voltage surges or reverse polarity connections in which the integrated circuit (IC) is adapted for connection to a load, particularly an inductive load such as the coil or solenoid of a relay.

Various protective networks have been proposed to protect circuit components against overvoltages or surges which occur, for example, when the inductive load is disconnected. One such arrangement includes a free wheeling or anti-inductive kick diode which is connected in parallel to the inductive load, and forming part, or at least a connection of the output of an IC. The cathode of the free wheeling diode is connected to the positive terminal of the IC to carry the reverse current due to the inductive kick. Such an arrangement has disadvantages when forming part of an IC since, if the IC includes an output transistor connected in series with the relay coil, the inherent diode formed by the components with respect to the substrate of the IC causes the output transistor to act like a diode, upon voltage reversal, the cathode of which is then facing, or effectively connected to the previously positive terminal. Upon voltage reversal or impression of a reverse voltage due to the inductive kick of an output coil, the substrate diode of the output transistor and the free wheeling diode together will form, effectively, a direct short circuit which will cause destruction of the integrated circuit element. It has previously been proposed to prevent such inadvertent short circuit currents by connecting an external, nonintegrated protective diode between the negative supply source and the output of the integrated circuit, the external protective diode being reversely polarized with respect to the substrate diode in order to prevent a direct short circuit.

The arrangement using an external diode has the disadvantage that, for one, the external diode cannot be integrated on the IC and thus requires an additional discrete element which additionally requires special connection; further, the circuit does not reliably resist overvoltages if an overvoltage or surge is superimposed on the normal supply circuit, which overvoltage or surge exceeds the breakdown voltage of the switching transistor.

The Invention

It is an object to provide a circuit arrangement or network in which an IC, adapted for connection to an inductive load can be protected against overvoltages or surges and which can be constructed, as far as possible, as a single integrated circuit.

Briefly, the series circuit comprising a diode and a voltage limiting element, such as a Zener diode or a Zener diode-resistor or resistor/transistor combination is connected in parallel to the main switching path, that is, the emitter-collector path of the final output transistor.

The circuit permits elimination of a non-integratable diode which previously was connected externally of the IC with respect to ground or chassis, and the entire IC can be integrated and, at most, needs an external resistor, externally connected to permit heat dissipation. This, however, is an inexpensive and readily connected item and is not absolutely necessary. The IC is protected against reverse polarity connection and against voltage surges. The internal overvoltage connecting network can be so dimensioned that it protects the circuit not only against external voltage surges but, additionally, against the inductive kick current if the load is highly inductive.

In accordance with a feature of the invention, provision of an external resistor simply and with little cost provides protection against inadvertent reverse-polarity connection of the IC, by connecting the junction of the rectifier or diode and the voltage limiting device to an external resistor which, in turn, is connected to the terminal of the supply voltage to which the load is likewise connected. The integrated circuit is then supplied with external power through the very same resistor.

Rise of the internal operating voltage of the IC up to the limit of the voltage of the voltage limiting device can be prevented, upon disconnecting the inductive load, by connecting the second terminal of the current limiting resistor, connected to the supply voltage, over a second de-coupling rectifier or diode, and then to the junction between the first de-coupling rectifier or diode and the voltage limiting element. In accordance with a feature of the invention, the rectifiers are constructed as transistors, connected in diode circuit connection; the voltage limiting device includes at least one Zener diode. When using the second de-coupling diode, transfer of the limiting voltage as determined by the voltage elements as internal operating voltage to the IC is prevented.

Drawings, illustrating an example:

Figure 1:
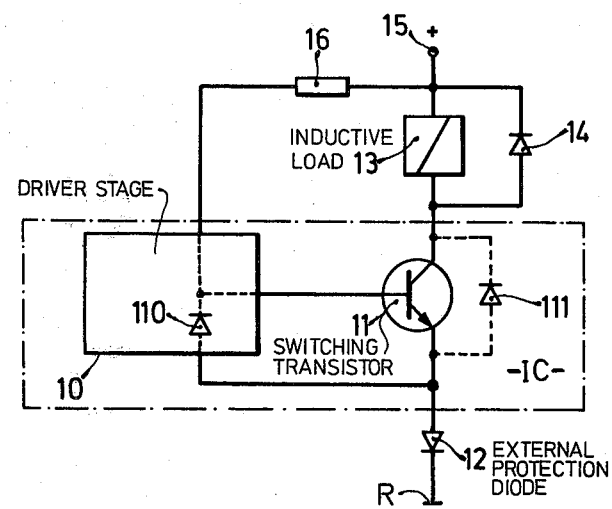
FIG. 1 is a schematic circuit diagram illustrating a typical IC connection as a control element for an inductive load, in accordance with the prior art.

The protective circuit illustrated in FIG. 1, and showing the prior art has an IC which includes a driver stage 10 and power stage 11, typically formed by a transistor. The driver stage 10 may be of any suitable construction and need not be described in detail, since it does not form part of the present invention. The end power stage 11 is a npn transistor, the base of which is connected to the driver stage 10, and conduction of which is controlled by the output of the driver stage. The driver stage 10 and the emitter of the output transistor 11 are connected through an external protective diode 12 to ground, or reference, indicated by terminal R. The collector of the power transistor 11 is connected to one terminal of a load, shown as a relay winding 13. The other terminal of the load is connected to a source of positive supply 15. A free wheeling diode 14 is connected in parallel to the load 13. The positive terminal 15 supplies the IC with power through a current limiting resistor 16, which is connected to the IC, for example at the driver stage 10 (as shown) or, alternatively, to the power stage 11. Usually, the current limiting resistor 16 is not integrated into the IC.

Operation of the circuit in accordance with the prior art (FIG. 1): The circuit as shown and described has, additionally, inherent diodes due to the integrated circuit construction. These inherent diodes are shown in broken lines as diodes 110, 111 in FIG. 1. The diodes bridge the respective driver stage and the end stage. Overvoltages which occur due to the inductive kick upon disconnection of the relay 13 are short circuited by the free wheeling diode 14. To protect the IC against inadvertent reversal of polarity of the source 15, or upon excess reverse voltages due to disconnection of inductive load 13, a protective diode 12 is provided, not integrated with the IC so that it is not additionally bridged, or short circuited by an inherent diode with respect to the substrate. Without presence of diode 12, reverse polarity connection, or an excess voltage inductive kick would cause a direct short circuit through diode 111 and free wheeling diode 14. The driver stage 10 which, as shown, also includes a substrate diode 110 is protected against excessive current upon polarity reversal by the external current limiting resistor 16.

The present invention is illustrated in connection with a circuit which, essentially, is similar in external function to that of FIG. 1. Similar elements have therefore been given similar reference numerals. The protective diode 12 and the free wheeling diode 14 can be eliminated, however. In parallel to the collector emitter path of the driver transistor 11, the series circuit of a diode 17 and a Zener diode 18 is provided. For a supply voltage in the order of twelve volts or so, a typical Zener voltage may be 8 V. The junction J of the diode 17 and the Zener diode 18 is connected through a normally blocked de-coupling diode 19 with the junction of the current limiting resistor 16 and the supply terminal to the IC, as shown, to the driver stage 10. The cathodes of the diode 17, 18, 19 are connected together.

Operation: The circuit provides dual protection: (a) Reverse priority: Upon reversal of polarity of the voltage source 15-R with respect to that shown in FIG. 2, current to the driver stage 10 will be limited by resistor 16. Current through the main switching path, that is, emitter-collector of transistor 11 is limited by the resistance of the solenoid 13 itself which is not bypassed by a diode. Due to the elimination of free wheeling diode 14, excess current cannot flow through transistor 11. (b) Disconnect voltage kick: If the voltage rises, for example due to sudden blocking of the power stage 11 to disconnect relay 13, a higher voltage will appear across the circuit formed by diode 17 and Zener diode 18. When this voltage exceeds the breakdown voltage of Zener diode 18 which, typically, has a breakdown value of about 8 V, Zener diode 18 will become conductive, and further voltage rise through diode 17 will be limited by Zener diode 18. The de-coupling diode 19 limits the voltage rise internally of the IC to the level of the limiting voltage of the Zener diode 18. Diodes 17, 18, 19 can be entirely integrated in an IC; the only external connection which will then be necessary will be the resistor 16 and the connection of the relay coil 13. The prior art (FIG. 1) usually also employs an externally connected resistor 16.

Figure 2:
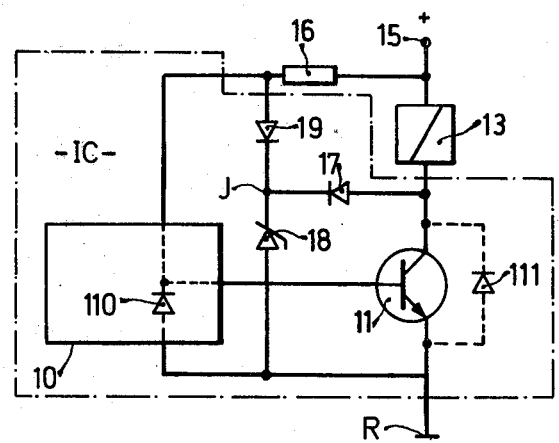
FIG. 2 is a schematic block diagram similar to FIG. 1, and illustrating the subject matter of the present invention and showing the difference in the circuit from the prior art.
Figure 3:
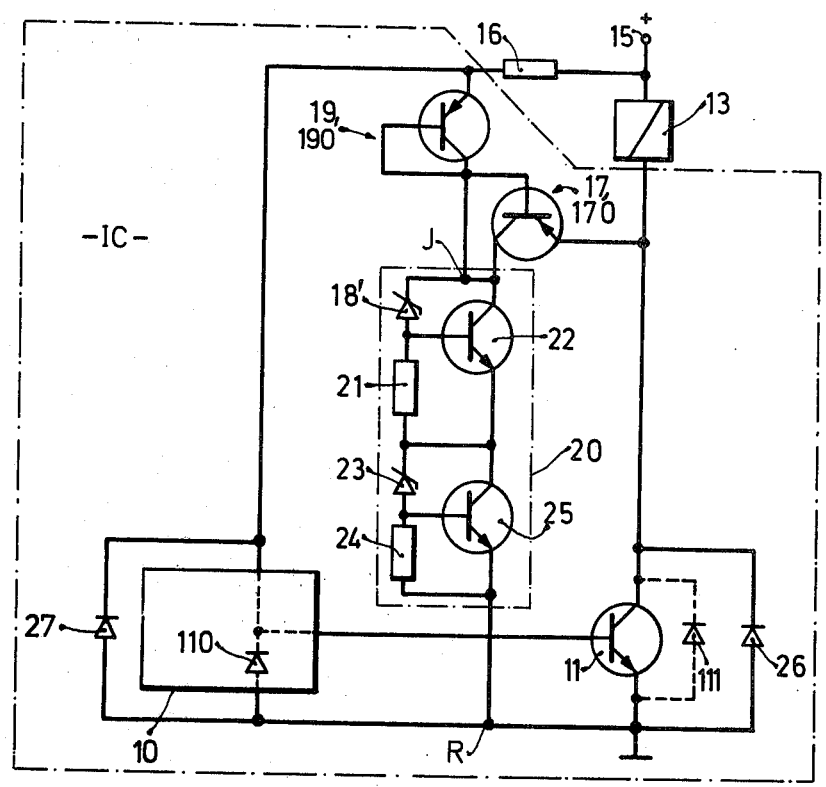
FIG. 3 is a more detailed schematic circuit diagram of an integrated protective circuit for an inductive load and FIGS. 4 and 5 are fragmentary circuit diagram illustrating various voltage limiting circuit arrangements.

FIG. 3 illustrates a detailed circuit diagram which operates in all respects similarly to the basic circuit shown and described in connection with FIG. 2. Diodes 17 and 19 are constructed, actually, as transistors 170, 190, connected as diodes by short circuiting the base-collector junction. This is standard practice in diode construction in ICs. Rather than providing an anode cathode path for diodes, the emitter-collector path of the pnp transistors are interconnected. The Zener diode 18 as such is replaced by a network 20. Network 20 uses a Zener diode 18' and a resistor 21 in series connection. The collector-emitter path of a transistor 22 is connected in parallel thereto, the base of the transistor 22 being connected to the junction between resistor 21 and Zener diode 18'. When the breakdown voltage of the Zener diode 18' is reached, the base of the transistor becomes conductive. This arrangement permits construction of the Zener diode 18' with lesser current carrying capabilities so that the Zener diode 18' will function only as a voltage sensing element. A second identical circuit, formed of Zener diode 23, resistor 24, and transistor 25 is series connected with the first circuit formed by Zener diode 18', resistor 21, and transistor 22. Cascading a plurality of such circuits permits increasing the breakdown or control voltage between terminals J and R; providing two such circuits in series doubles the breakdown voltage, that is, doubles the limiting voltage of the circuit 20. Additional such combinations can be series connected (not shown) to further increase the breakdown voltage, as desired. Similarly, additional Zener diodes 18 could be series connected in the circuit of FIG. 2.

An additional polarity reversal protective diode 26 is connected in parallel to the power or output stage 11. The polarity protective diode 26 is connected across the main current carrying path of the output stage to provide current carrying relief of the substrate diode 111 of the output transistor 11, since substrate diodes are parasitic elements and do not provide good current carrying capabilities or can be classified as proper, or desirable or good diodes. The polarity reversal protective diode 26 can be desirably used also in all embodiments of the present invention. An additional polarity reversal diode 27 can be connected across driver stage 10 in similar manner to also protect the driver stage 20 without placing exclusive reliance on the inherent substrate diode 110.

Figure 4:
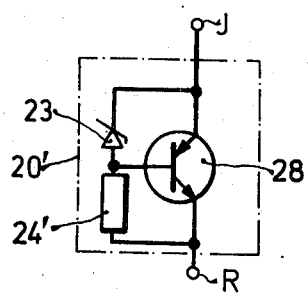

FIG. 4 illustrates an alternative voltage limiting circuit 20', to replace circuit 20 of FIG. 3. Rather than using a transistor 22, or 25, a four-layer triode 28 is used. Resistor 24' should be so dimensioned that, in normal operation and during disconnection of the solenoid winding load 13, the four-layer triode 28 is not triggered. If, however, sudden voltage surges are externally introduced into the circuit, the four-layer triode 28 will fire when a certain predetermined current will flow through resistor 24'. The element 28 will then breakdown and will conduct its rated current. The advantage of this arrangement is substantial reduction of the $I^2R$ losses at highly excessive overvoltages or surges within the IC with respect to the losses, and consequential heating of the IC, with respect to the transistor arrangement as shown in FIG. 3.

Figure 5:
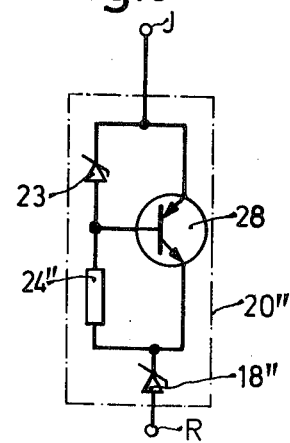

FIG. 5 adds to the circuit of FIG. 4 an additional Zener diode 18", in series with the circuit combination including a four-layer triode 18". This circuit has the advantage that after breakdown, drop of the voltage even below twice the Zener voltage will continue to maintain the circuit in conduction. The resistor 24" should be dimensioned similar to the dimensioning of the resistor 24' (FIG. 4).

The circuit can be used with arrangements in which the inductive load 13 is connected to the negative or reference terminal of the supply source. In such a case, the protective resistor 16 should be connected to the negative supply line of the IC, and the switching transistor will be constructed as a pnp transistor. The excess voltage protective circuit 20 and diode 19 is to be interchanged, and the polarity of diode 17 must be reversed, so that the three diodes 17, 18 and 19 will have their anodes connected to a common junction.

Various changes and modifications may be made and feature described in connection with any one of the embodiments may be used with any of the others, within the scope of the inventive concept.

We claim:

1. Reverse polarity and excess voltage protected integrated circuit network in combination with and to control connection to an unbypassed load (13), particularly an unbypassed inductive load which is coupled to a power source (15), to protect an integrated load switching control circuit for said load against voltage surges and reverse polarity, said integrated circuit having a controlled semiconductor switch (11), serially connectable with the load (13) and the power source (15);

a current limiting resistor (16) having at least first and second terminals, one terminal being connected to the power source (15) to which the load (13) is connected;

control means (10) coupled to said other terminal of said current limiting resistor (16) and to the controlled semiconductor switch (11) for controlling the conduction state of said controlled semiconductor switch (11);

and a protective circuit connected in parallel to the main current switching path of the controlled semiconductor switch (11) comprising a series circuit having a diode (17), and a voltage responsive element (18, 20, 20', 20'') which becomes conductive when the voltage thereacross exceeds a predetermined limit, the diode and the voltage responsive element having a common junction (J) therebetween, said common junction (J) being coupled to said other terminal of said current limiting resistor (16), said series circuit (17; 18, 20) in parallel to the switching path of the controlled semiconductor switch (11) becoming conductive upon presence of a reverse voltage in excess of the breakdown voltage and the voltage drop across the load upon disconnection of the load, or application of reverse polarity due to improper poling of said source and limiting the voltage across the main current switching path of the controlled semiconductor switch to essentially said breakdown voltage and current flow through said controlled semiconductor switch and said protective circuit by the internal resistance of the load.

2. Network according to claim 1 wherein the voltage responsive element (18, 20) includes at least one Zener diode.

3. Network according to claim 1 wherein (FIGS. 4, 5) the voltage responsive element (20', 20'') includes at least a four-layer triode (28).

4. Network according to claim 1 wherein (FIGS. 3, 4, 5) the voltage responsive element includes at least one switchable, controlled semiconductor switching element (22, 25, 28), having a controlled electrode, and at least one Zener diode (18', 23) connected to and controlling the controlled electrode.

5. Network according to claim 4 wherein (FIG. 3) at least one respective resistor (21, 24) is connected in series with said at least one respective Zener diode (18', 23), the respective Zener diode-resistance series circuit being connected across the main switching path of the controlled semiconductor switching element (22, 25), the junction between the Zener diode (18', 23) and the respective resistor (21, 24) forming a control terminal and being connected to and controlling the respective semiconductor switching element (22, 25).

6. Network according to claim 5, wherein the controlled semiconductor switching element (22, 25) comprises a transistor.

7. Network according to claim 5 wherein (FIG. 4) the controlled semiconductor switching element comprises a four-layer triode (28).

8. Network according to claim 5 wherein (FIG. 5) the controlled semiconductor switching element comprises a four-layer triode (28), and an additional voltage responsive element (18'') is serially connected with said four-layer triode (28).

9. Network according to claim 1, further comprising a de-coupling rectifier (19) coupling said common junction (J) to said other terminal of said current limiting resistor (16).

10. Network according to claim 9, wherein said de-coupling rectifier (19) is poled with its cathode coupled to said common junction (J) and its anode coupled to said other terminal of said current limiting resistor (16).

11. Network according to claim 9 wherein the de-coupling rectifier (19) is a diode.

12. Network according to claim 1 wherein said integrated circuit includes a plurality of diodes (17, 18, 18', 23, 19);

and wherein at least one of said diodes, in integrated form, is constructed as a transistor in diode connection.

13. Network according to claim 1 wherein (FIGS. 3-5) the voltage responsive element comprises a plurality of serially cascaded semiconductor breakdown elements.

14. Reverse polarity and excess voltage protected integrated circuit network in combination with and to control connection to an unbypassed load (13), particularly an unbypassed inductive load which is coupled to a power source (15), to protect an integrated load switching control circuit for said load against voltage surges and reverse polarity, said integrated circuit having a controlled semiconductor switch (11), serially connectable with the load (13) and the power source (15);

control means (10) coupled to the controlled semiconductor switch (11) for controlling the conduction state of said controlled semiconductor switch (11);

and a protective circuit connected in parallel to the main current switching path of the controlled semiconductor switch (11) comprising a series circuit having a diode (17), and a voltage responsive element which becomes conductive when the voltage thereacross exceeds a predetermined limit, the voltage responsive element including at least one switchable, controlled semiconductor switching element (22, 25, 28) having a controlled electrode, at least one Zener diode (18', 23) connected to and controlling the controlled electrode, at least one respective resistor (21, 24) connected in series with said at least one respective Zener diode (18', 23), the respective Zener diode-resistance series circuit being connected across the main switching path of the controlled semiconductor switching element (22, 25, 28), the junction between the Zener diode (18', 23) and the respective resistor (21, 24) forming a control terminal and being connected to and controlling the respective semiconductor switching element (22, 25), said series circuit (17; 18, 20) of said diode (17) and voltage responsive element becoming conductive upon presence of a reverse voltage in excess of the breakdown voltage and the voltage drop across the load upon disconnection of the load, or application of reverse polarity due to improper poling of said source and limiting the voltage across the main current switching path of the controlled semiconductor switch to essentially said breakdown voltage and current flow through said controlled semiconductor switch and said protective circuit by the internal resistance of the load.

15. Network according to claim 14 wherein the controlled semiconductor switching element (22, 25) comprises a transistor.

16. Network according to claim 14 wherein (FIG. 4) the controlled semiconductor switching element comprises a four-layer triode (28).

17. Network according to claim 14 wherein (FIG. 5) the controlled semiconductor switching element comprises a four-layer triode (28), and an additional voltage responsive element (18") is serially connected with said four-layer triode (28).

* * * * *